United States Patent
Zeng et al.

(10) Patent No.: US 9,472,464 B1
(45) Date of Patent: Oct. 18, 2016

(54) METHODS TO UTILIZE MERGED SPACERS FOR USE IN FIN GENERATION IN TAPERED IC DEVICES

(71) Applicant: GLOBALFOUNDRIES Inc., Grand Cayman (KY)

(72) Inventors: Jia Zeng, Sunnyvale, CA (US); Lei Yuan, Cupertino, CA (US); Youngtag Woo, San Ramon, CA (US); Yan Wang, San Jose, CA (US); Jongwook Kye, Pleasanton, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/060,691

(22) Filed: Mar. 4, 2016

(51) Int. Cl.
*H01L 21/8238* (2006.01)
*H01L 29/66* (2006.01)
*H01L 21/308* (2006.01)

(52) U.S. Cl.
CPC ... *H01L 21/823821* (2013.01); *H01L 21/3086* (2013.01); *H01L 29/6653* (2013.01); *H01L 29/6656* (2013.01); *H01L 29/66553* (2013.01)

(58) Field of Classification Search
None
See application file for complete search history.

(56) References Cited

U.S. PATENT DOCUMENTS

| | | | |
|---|---|---|---|
| 2015/0056724 A1* | 2/2015 | Shieh | H01L 22/12 438/14 |
| 2015/0262876 A1* | 9/2015 | Yang | H01L 21/76897 257/401 |
| 2016/0163600 A1* | 6/2016 | Colburn | H01L 21/823431 438/692 |

* cited by examiner

*Primary Examiner* — Angel Roman
(74) *Attorney, Agent, or Firm* — Ditthavong & Steiner, P.C.

(57) ABSTRACT

Methods for processes to form and use merged spacers in fin generation and the resulting devices are disclosed. Embodiments include providing first and second mandrels separated from each other across adjacent cells on a Si layer; forming first and second dummy-spacers and third and fourth dummy-spacers on opposite sides of the first and second mandrels, respectively; removing, through a block-mask, the first and fourth dummy spacers and a portion of the second and third dummy-spacers; forming first spacers on each exposed side of the mandrels and in between the second and third dummy-spacers, forming a merged spacer; removing the mandrels; removing a section of the merged-spacer; forming second spacers on all exposed sides of the first spacers and the merged-spacer; removing the merged-spacer and the first spacers; removing exposed sections of the Si layer through the second spacers; and removing the second spacers to reveal Si fins.

20 Claims, 14 Drawing Sheets

METHODS TO UTILIZE MERGED SPACERS FOR USE IN FIN GENERATION IN TAPERED IC DEVICES

TECHNICAL FIELD

The present disclosure relates generally to designing and fabricating integrated circuit (IC) devices. The present disclosure is particularly applicable to forming fins for the 7 nanometer (nm) technology node and beyond.

BACKGROUND

Generally, in the fabrication of IC devices, lithography processes may be utilized to print/pattern cavities, trenches, recessed-areas, and other elements for creating various components and circuits. Various process operations, such as etching, may then be performed on the underlying layer of material or substrate through patterned block or cut masks. However, with advancements in processes utilized to manufacture IC devices as well as industry demand for more efficient and smaller sized devices, physical dimensions of the elements as well as their proximity to each other are reduced. As a result, spaces between adjacent elements may be reduced causing a reduction in error tolerance/thresholds in various fabrication processes. For example, in scaling of fin-type devices (e.g., 7 nm or smaller), a smaller fin-pitch (FP) and reduced space between the silicon (Si) fins render forming and removing of the fins challenging.

Figure 1:
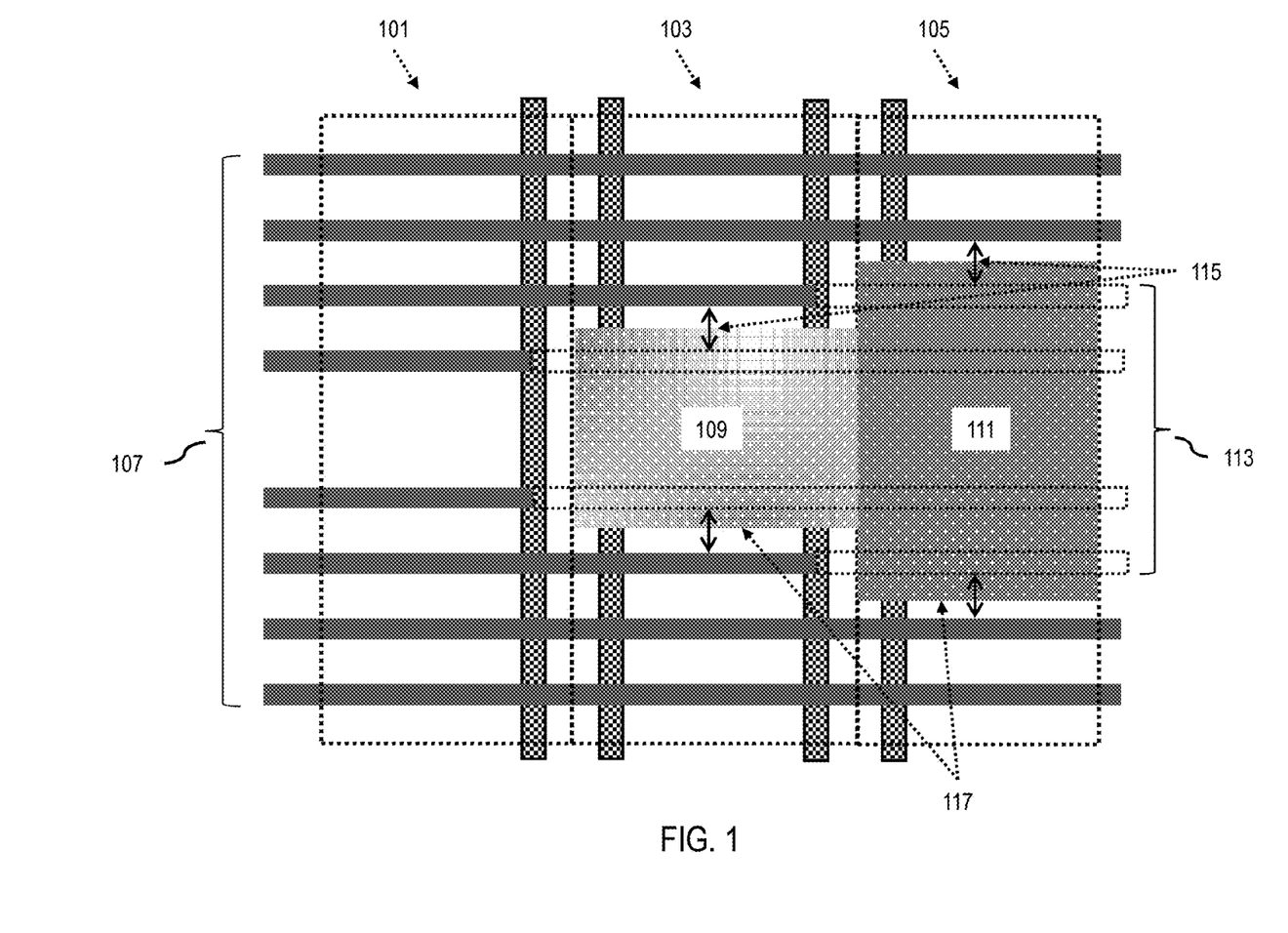
FIG. 1 schematically illustrates an example layout diagram for removing fins in a FINFET device.

FIG. 1 schematically illustrates an example layout diagram of a FINFET device including cells 101, 103, and 105 that include a various number of fins 107. For example, each cell includes a p-FET and n-FET device, wherein the cells 101, 103, and 105 include four active fins, three active fins, and two active fins, respectively, for each device. However, since four active fins are formed initially per device in each cell, cut-masks 109 and 111 are utilized to remove a subset of fins 113 that are not necessary in the cells 103 and 105. Here, a total tolerance level for placement/alignment of a cut-mask (e.g. 109) would be equal to a space 115 between adjacent fins (e.g. 18 nm or +/−9 nm for a 6 nm fin width). As noted, with reduced spaces between the adjacent fins or elements in highly integrated devices, accurate alignment of edges 117 (e.g. of the masks 109/111) can become increasingly challenging and prone to errors, which can impact the fabrication efficiencies and reliability of the IC devices.

Therefore, a need exists for a methodology enabling fin generation in tapered FINFET devices with increased edge placement error (EPE) tolerance with no additional masks.

SUMMARY

An aspect of the present disclosure is a method for increasing error tolerance for placement of lithography masks utilized in formation or removal of spacers used to generate fins in a tapered FINFET device.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure some technical effects may be achieved in part by a method including providing first and second mandrels separated from each other across adjacent cells on an upper surface of a Si layer; forming first and second dummy spacers and third and fourth dummy spacers on opposite sides of the first and second mandrels, respectively; removing, through a block mask, the first and fourth dummy spacers and a portion of the second and third dummy spacers; forming first spacers on each exposed side of the first and second mandrels and in between the second and third dummy spacers, forming a merged spacer; removing the mandrels; removing a section of the merged spacer; forming second spacers on all exposed sides of the first spacers and the merged spacer; removing the merged spacer and the first spacers; removing exposed sections of the Si layer through the second spacers; and removing the second spacers to reveal Si fins.

One aspect includes providing the first and second mandrels across first, second, and third consecutive cells; and utilizing the block mask to block the second and third dummy spacers in the second and third cells.

In another aspect, a placement of the block mask has a total EPE tolerance equal to a sum of a distance between two adjacent Si fins and twice a width of a Si fin.

Another aspect includes removing the section of the merged spacer through a cut-mask with an opening over the merged spacer in the third cell.

An additional aspect includes utilizing a cut-mask with openings over boundaries between the first and second, and the second and third cells; and removing, through the openings, segments of the Si fins over and adjacent to the boundaries.

In a further aspect, each cell comprises at least one n-FET and at least one p-FET, the first cell includes four active Si fins for each n-FET and p-FET, the second cell includes three active Si fins for each n-FET and p-FET, and the third cell includes two active Si fins for each n-FET and p-FET.

In another aspect, the first spacers have a width corresponding to a space between two adjacent Si fins.

In one aspect, the second spacers have a width corresponding to a Si fin width.

In an additional aspect, the mandrels have a pitch corresponding to at least four times a Si fin pitch.

According to the present disclosure some technical effects may be achieved in part by a method including providing first and second mandrels separated from each other across adjacent cells on an upper surface of Si layer; forming first and second dummy spacers and third and fourth dummy spacers on opposite sides of the first and second mandrels, respectively; removing, through a block mask, the first and fourth dummy spacers and a portion of the second and third dummy spacers; forming first spacers on each exposed side of the first and second mandrels and in between the second and third dummy spacers, forming a merged spacer; removing the first and second mandrels; removing the first spacers to one side of the merged spacer; forming second spacers on all exposed sides of the first spacers and the merged spacer; removing the merged spacer and the first spacers; removing exposed sections of the Si layer through the second spacers; and removing the second spacers to reveal Si fins.

One aspect includes providing the first and second mandrels across first, second, and third consecutive cells; and utilizing the block mask to block the second and third dummy spacers in the second cell only.

In one aspect, a placement of the block mask has a total EPE tolerance equal to a sum of a distance between two adjacent Si fins and twice a width of a Si fin.

A further aspect includes removing the first spacers to one side of the merged spacer through a cut-mask with an opening in the third cell.

Another aspect includes utilizing a cut-mask with openings over boundaries between the first and second, and the second and third cells; and removing, through the openings, segments of the Si fins over and adjacent to the boundaries.

In an additional aspect, each cell comprises at least one n-FET and at least one p-FET, the first cell includes four active Si fins for each n-FET and p-FET, the second cell includes three active Si fins for each n-FET and p-FET, and the third cell includes two active Si fins for each n-FET and p-FET.

In one aspect, the first spacers have a width corresponding to a space between two adjacent Si fins, and the second spacers have a width corresponding to a Si fin width.

In a further aspect, the mandrels have a pitch corresponding to at least four times a Si fin pitch.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

For the purposes of clarity, in the following description, numerous specific details are set forth to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the problem of reduced EPE tolerance levels attendant upon lithography processes for forming or removing spacers in an IC device for advanced technology nodes. The present disclosure addresses and solves such problems, for instance, by, inter alia, utilizing a merged spacer in conjunction with a cut mask prior to fin formation in a tapered FINFET device.

Figure 2A:
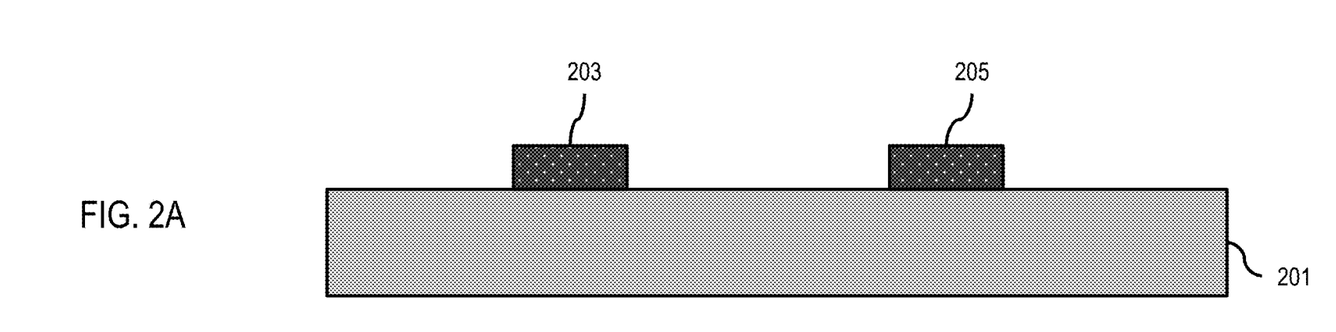
FIGS. 2A through 2W illustrate cross-sectional and top views of cells and processes for forming or removing spacers utilized in forming fins in a tapered FINFET device, in accordance with an exemplary embodiment.

FIG. 2A illustrates a cross sectional view of a Si substrate layer 201 and first and second mandrels, 203 and 205, separated from each other across adjacent cells, on an upper surface of the Si layer 201. The position and number of the mandrels may vary according to a design and fabrication of a target device such as a logic cell, which may be adjacent to another logic cell. The mandrels have a pitch corresponding to at least four times a Si fin pitch in a target cell and a width corresponding to a Si fin width plus one Si fin pitch.

Figure 2B:
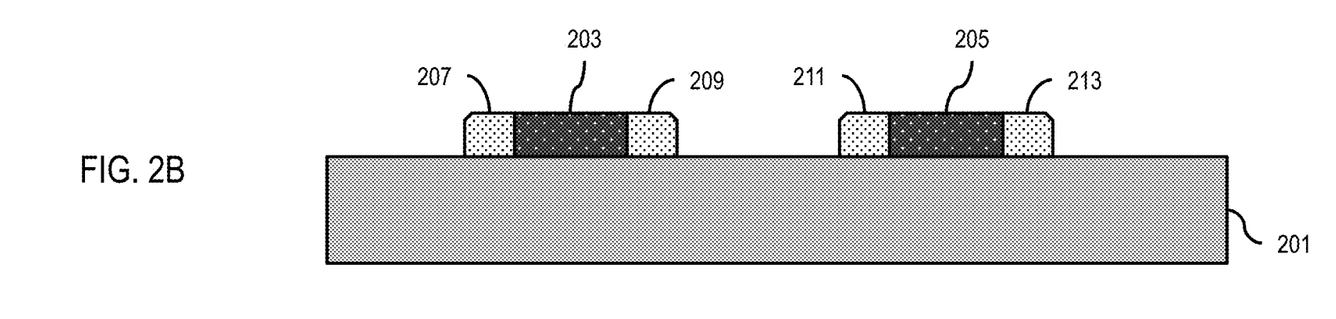

In a cross sectional view in FIG. 2B, first and second dummy spacers, 207 and 209, may be formed on opposite sides of the first mandrel 203; third and fourth dummy spacers, 211 and 213, may be formed on opposite sides of the second mandrel 205.

Figure 2C:
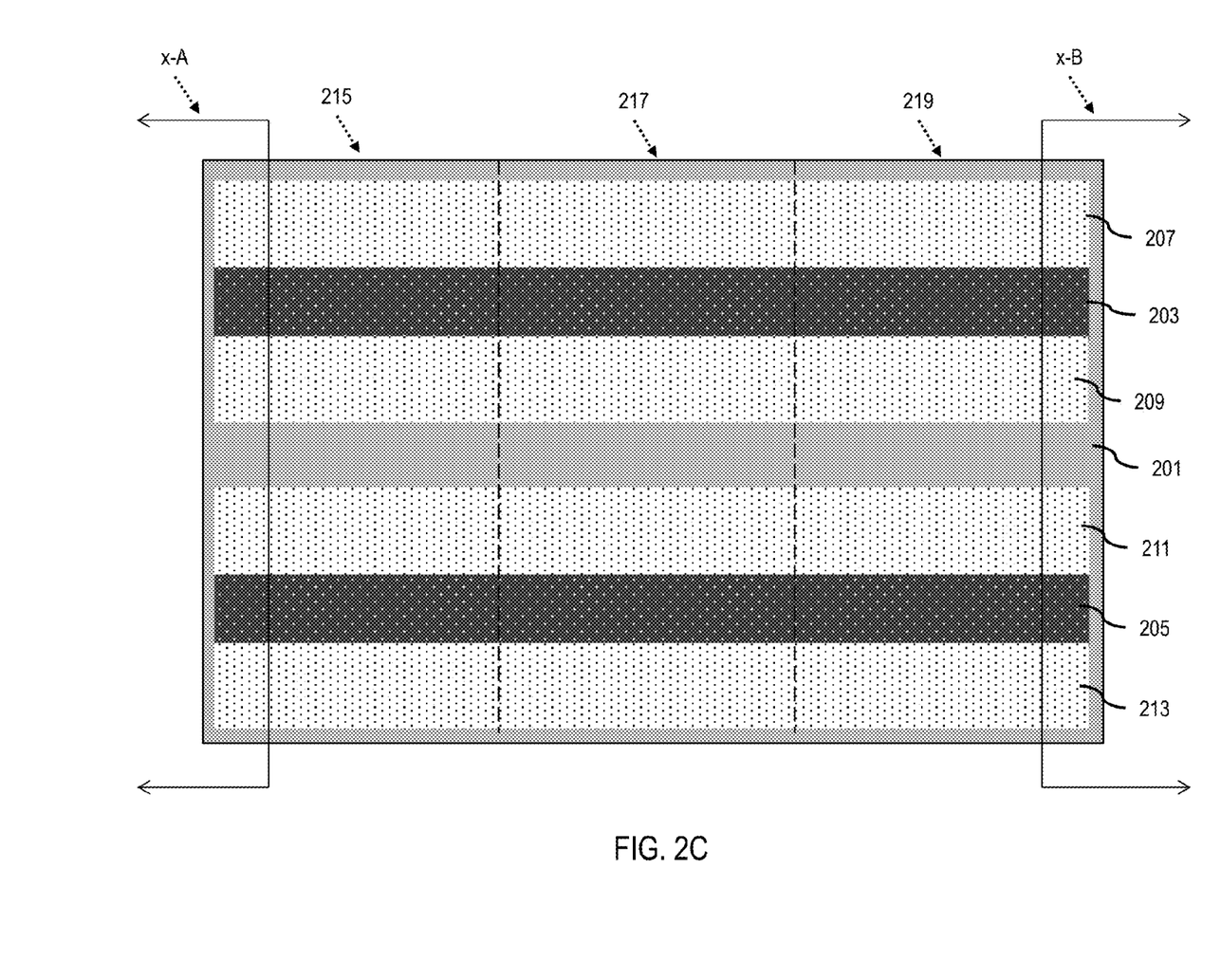

FIG. 2C illustrates a top view of the elements of FIG. 2B across first, second, and third cells, 215, 217, and 219, respectively. Also illustrated are cross sectional view indicators "x-A" (view along x-A) and "x-B" (view along x-B) that will be referred to in below figures and related discussions.

Figure 2D:
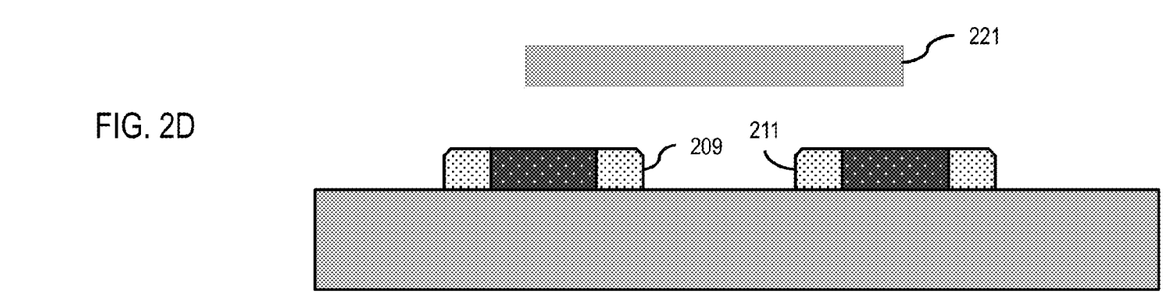
Figure 2E:
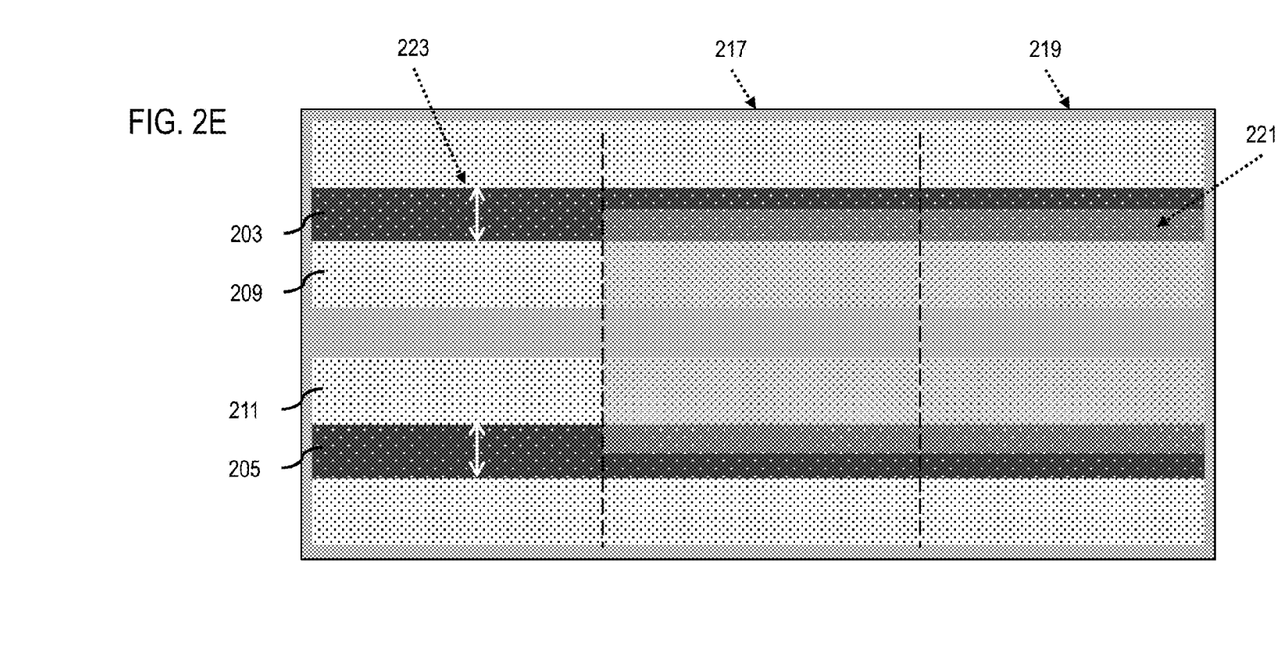

FIG. 2D illustrates a view along x-B, wherein a block mask 221 may be utilized to block a portion of the second and third dummy spacers, 209 and 211 (e.g., in the second/third cells, 217/219.) FIG. 2E illustrates a top view of the elements as discussed in relation to FIG. 2D. It is noted that width 223 of each of the first and second mandrels, 203 and 205, provides an ample threshold/tolerance for placement/alignment of the block mask 221. For instance, given a particular targeted fin width and pitch, the placement of the block mask 221 has a total EPE tolerance equal to a sum of a distance/space between two adjacent Si fins and twice a width of a Si fin.

Figure 2F:
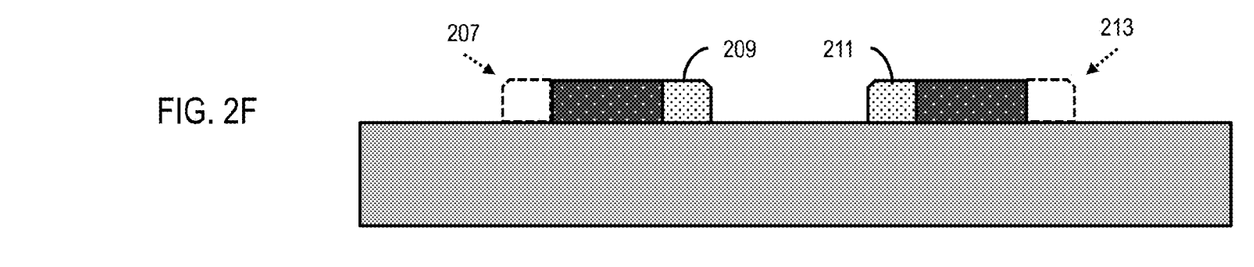
Figure 2G:
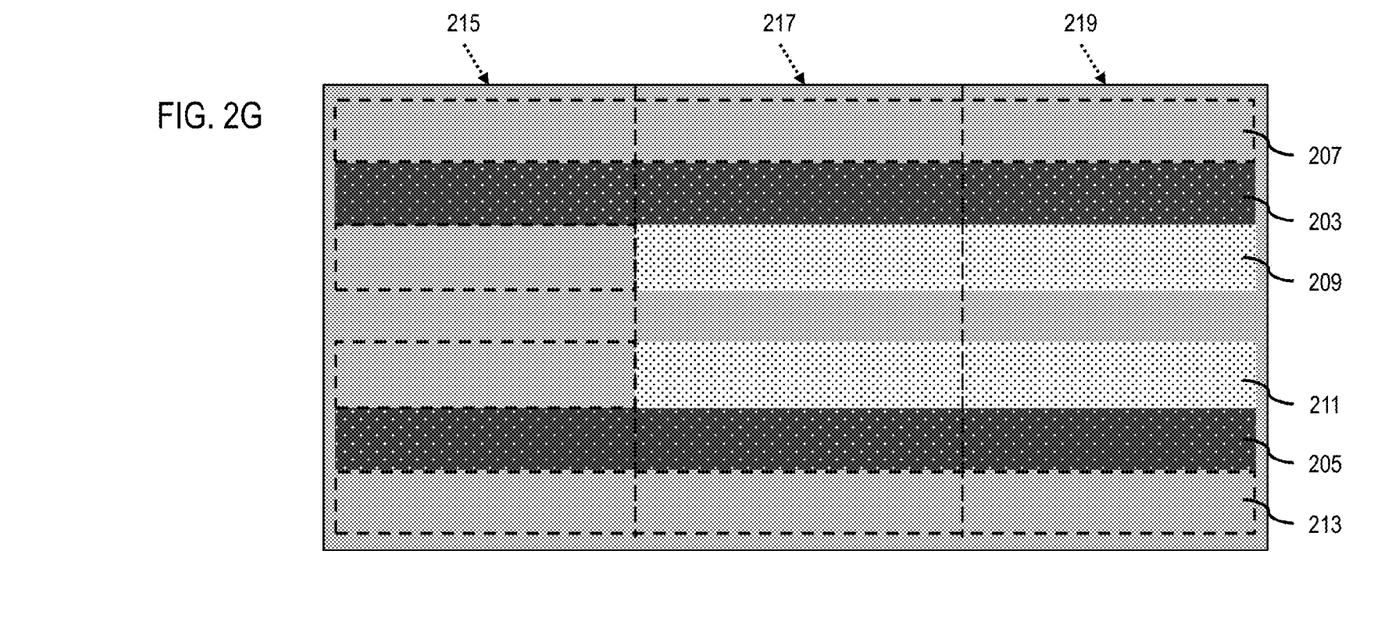

FIG. 2F illustrates a view along x-B, wherein the first and fourth dummy spacers, 207/213, as well as a section of the second and third dummy spacers, 209/211 (e.g., in the first cell 215) are removed, through the block mask 221, leaving a section of the second and third dummy spacers, 209/211, in a space between the first and second mandrels, 203 and 205, in the second and third cells, 217 and 219. FIG. 2G illustrates a top view of the elements as discussed in relation with FIG. 2F.

Figure 2H:
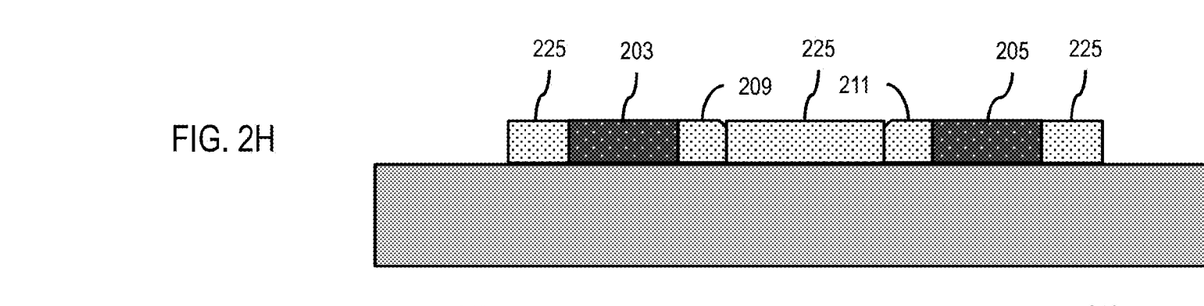
Figure 2I:
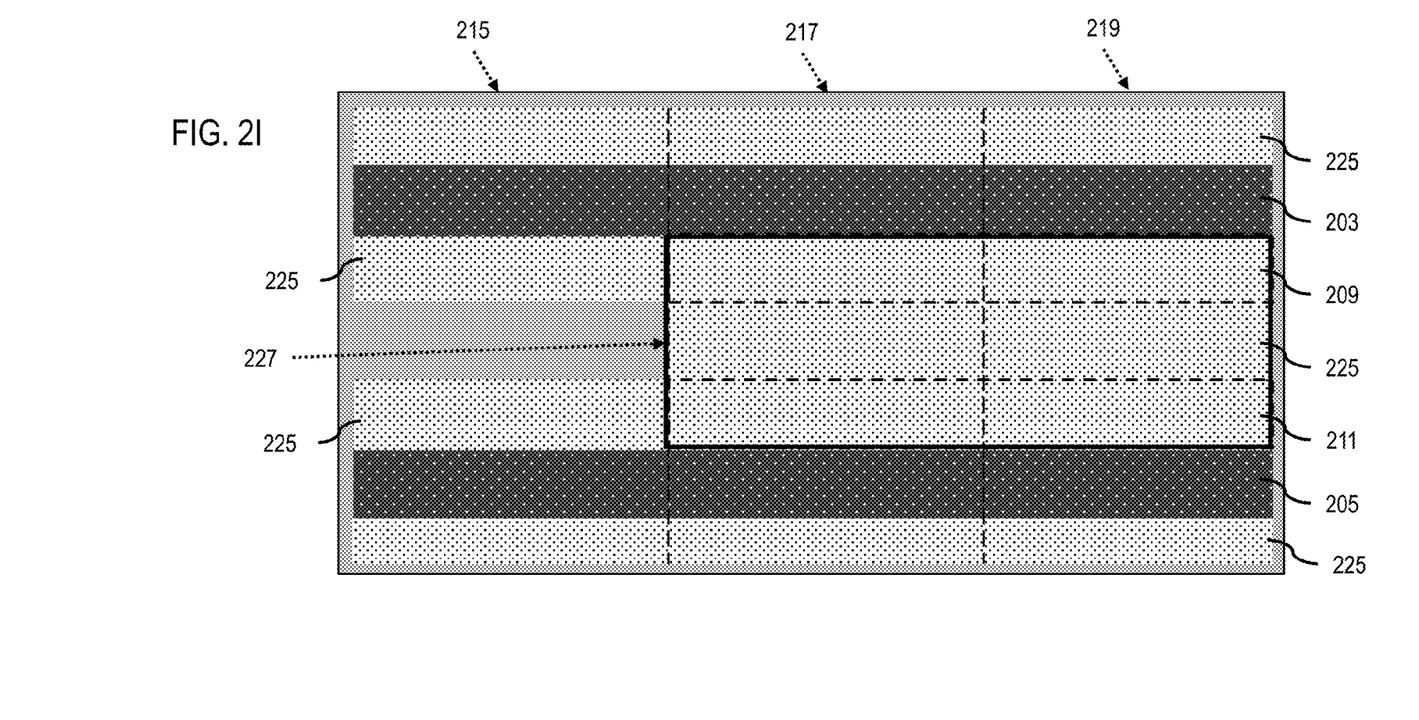

FIG. 2H illustrates a view along x-B, wherein first spacers 225 are formed on each exposed side of the first and second mandrels, 203 and 205, as well as in a space between the second and third dummy spacers, 209 and 211. FIG. 2I illustrates a top view of the elements of FIG. 2I, where the first spacer 225 is formed in all cells (215/217/219) on exposed outer-side of each of the first and second mandrels, 203 and 205. Also illustrated are the first spacers 225 formed in the first cell 215 on an exposed inner side of each of the first and second mandrels, 203 and 205. Further, the first spacer 225 is formed in the second and third cells, 217 and 219, in between the originally formed dummy spacers, 209 and 211, forming a merged spacer 227. Given a particular targeted fin width and pitch, the first spacers 225 have a width corresponding to a space between two adjacent fins.

Figure 2J:
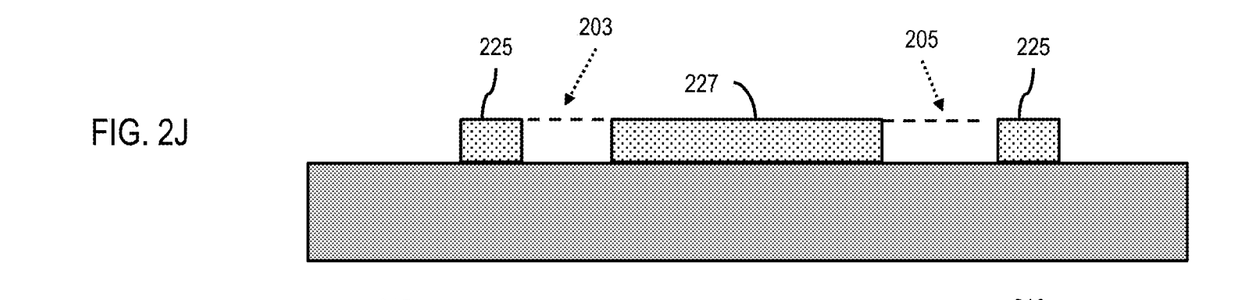
Figure 2K:
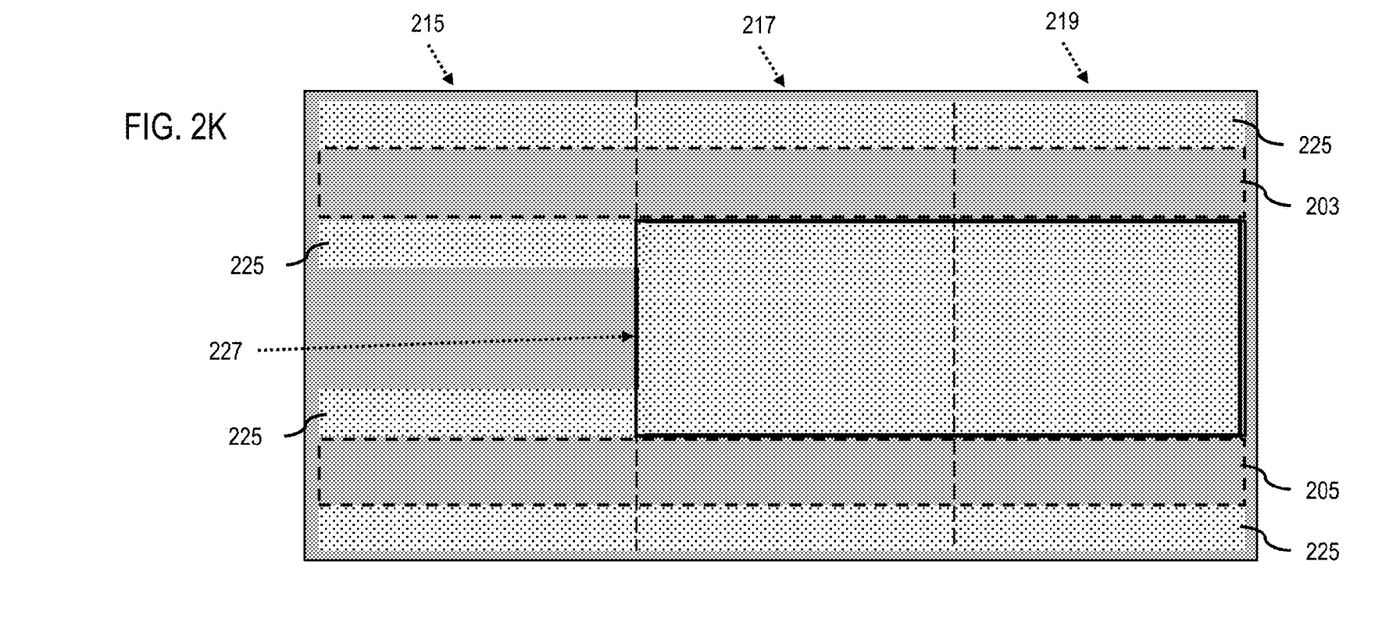

FIG. 2J illustrates a view along x-B, wherein the first and second mandrels, 203 and 205, are removed leaving the first spacers 225 and the merged spacer 227. FIG. 2K illustrates a top view of the first spacers 225 as well as the merged spacer 227 in the second and third cells, 217 and 219.

Figure 2L:
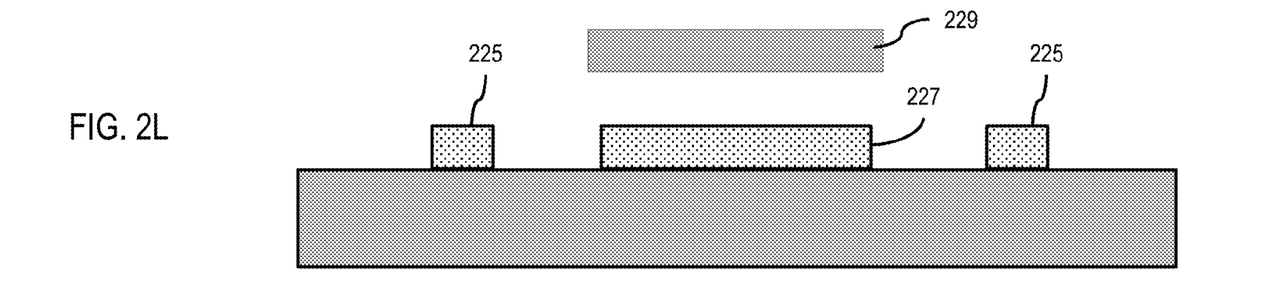
Figure 2M:
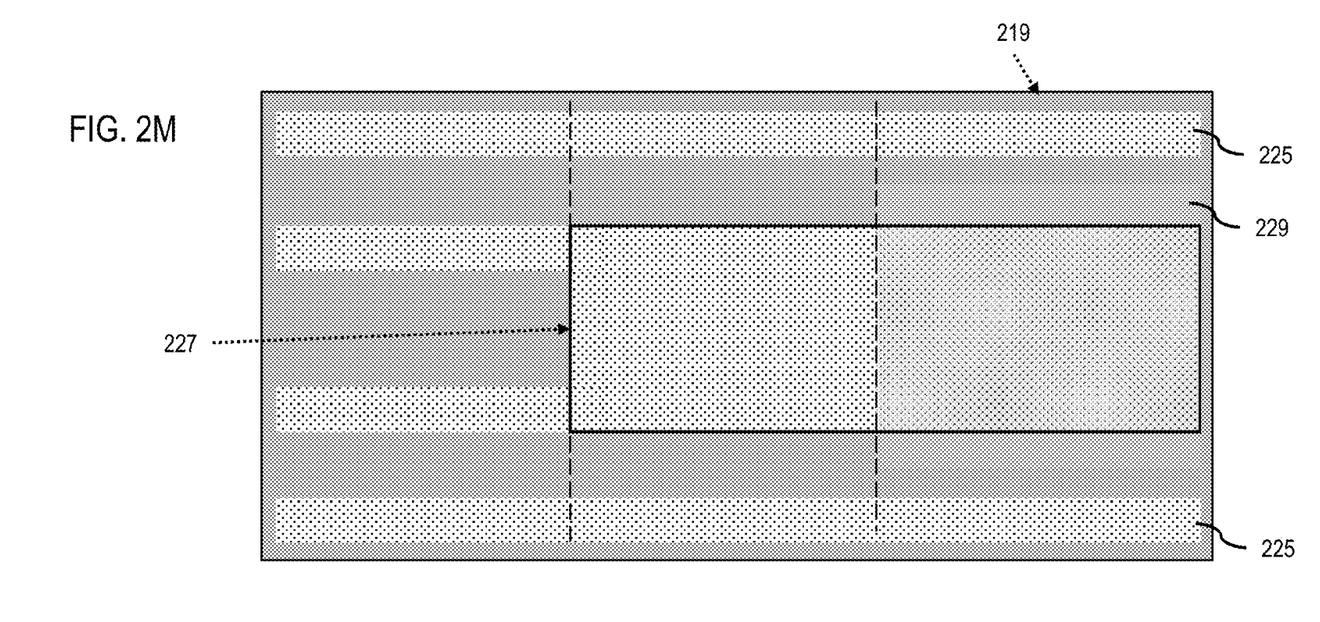

FIG. 2L illustrates a view along x-B, wherein a cut-mask 229 may be utilized to remove a section of the merged spacer 227. As in a top view illustrated in FIG. 2M, the cut-mask 229 is over a section of the merged spacer 227 in between the first spacers 225 in the third cell 219.

Figure 2N:
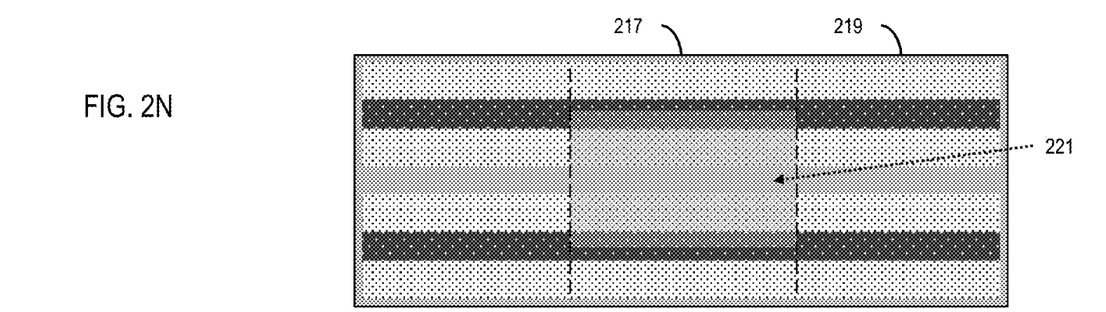
Figure 2O:
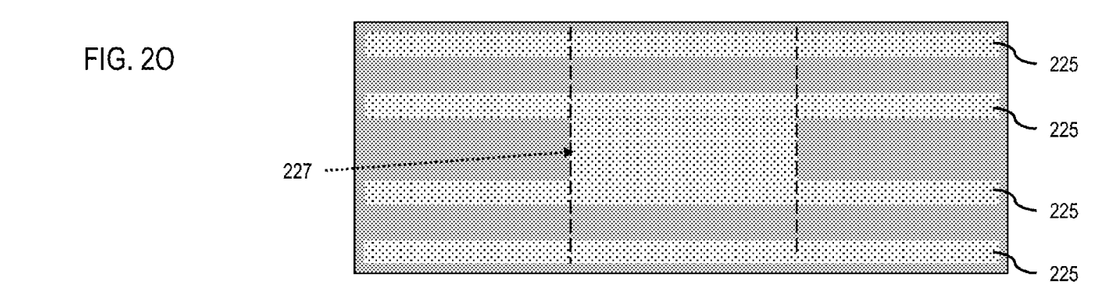
Figure 2P:
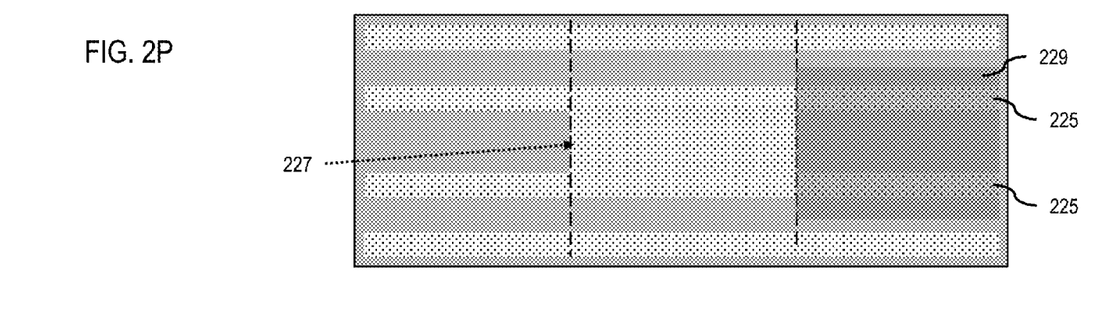

FIGS. 2N through 2P illustrate a top view of an alternate process to that of FIGS. 2E through 2M. Adverting to FIG. 2N, instead of utilizing the block mask 221 in the second and third cells, 217 and 219, the block mask 221 is utilized in the second cell 217 only. FIG. 2O illustrates a top view wherein the merged spacer 227 is formed only in the second cell 217, and the third cell 219 includes only first spacers 225. FIG. 2P illustrates a top view wherein the cut-mask 229 is utilized to remove two of the first spacers 225, adjacent to the merged spacer 227, in the third cell 219.

Figure 2Q:
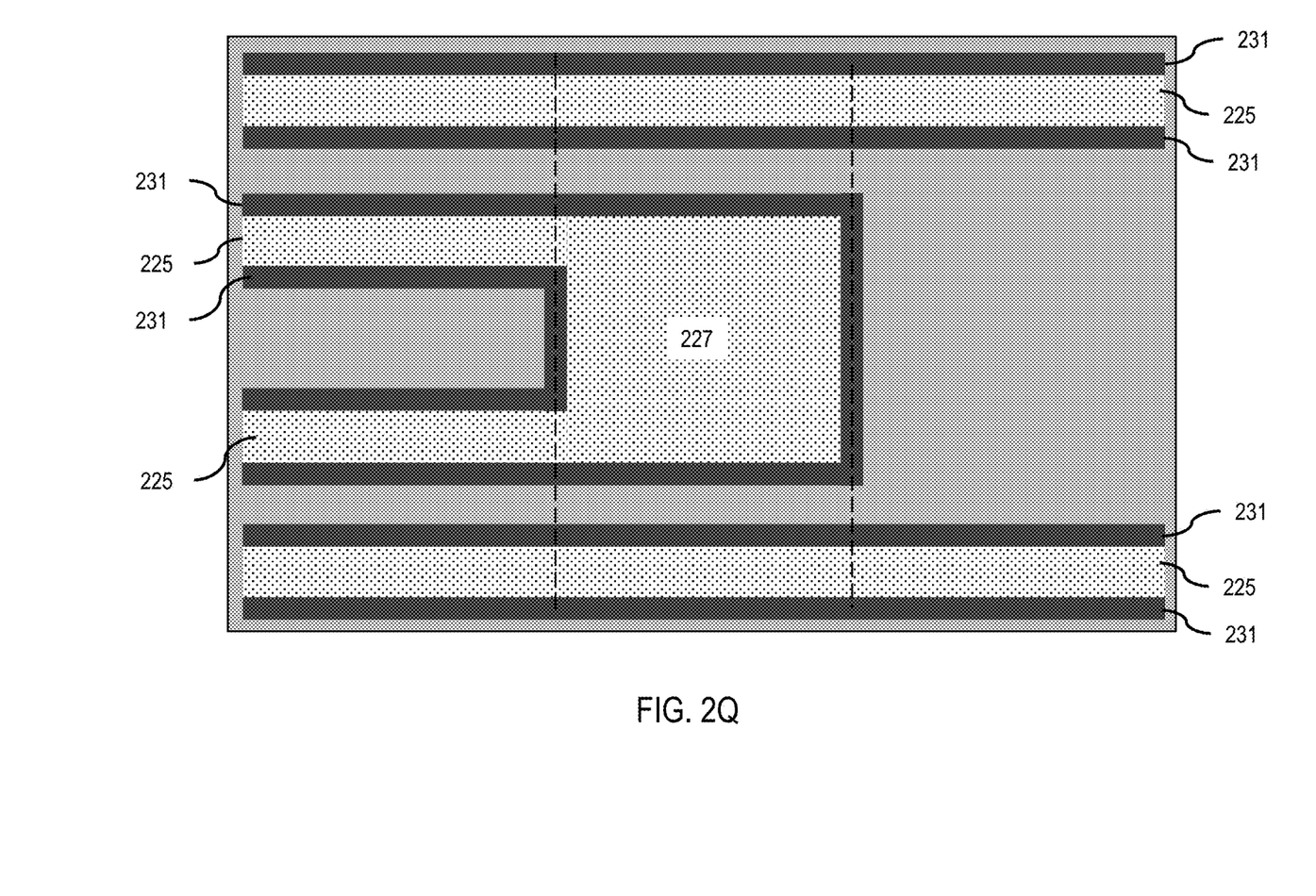

FIG. 2Q illustrates a top view following either of the two above described processes where the first spacers 225 and merged spacer 227 effectively form second mandrels. Second spacers 231 are formed on all exposed sides of the second mandrels (i.e. the first spacers 225 and the merged spacer 227). Given a particular targeted fin width and pitch, the second spacers have a width corresponding to a Si fin width.

Figure 2R:
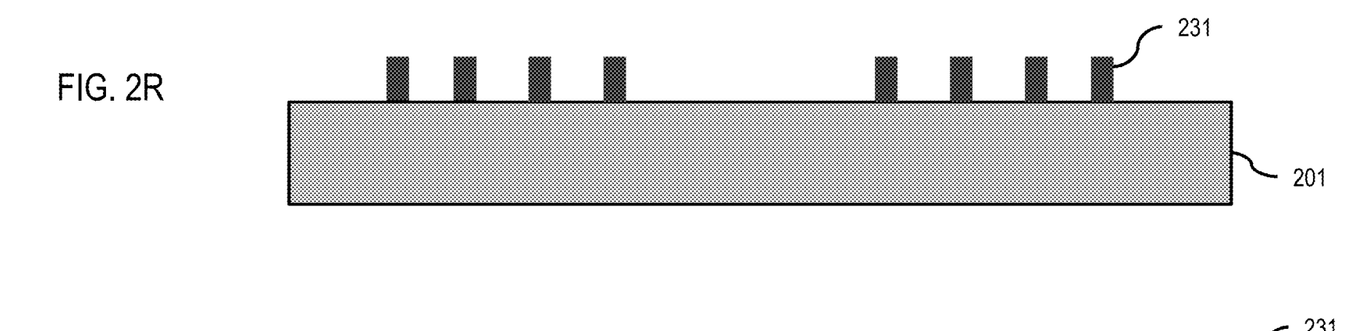
Figure 2S:
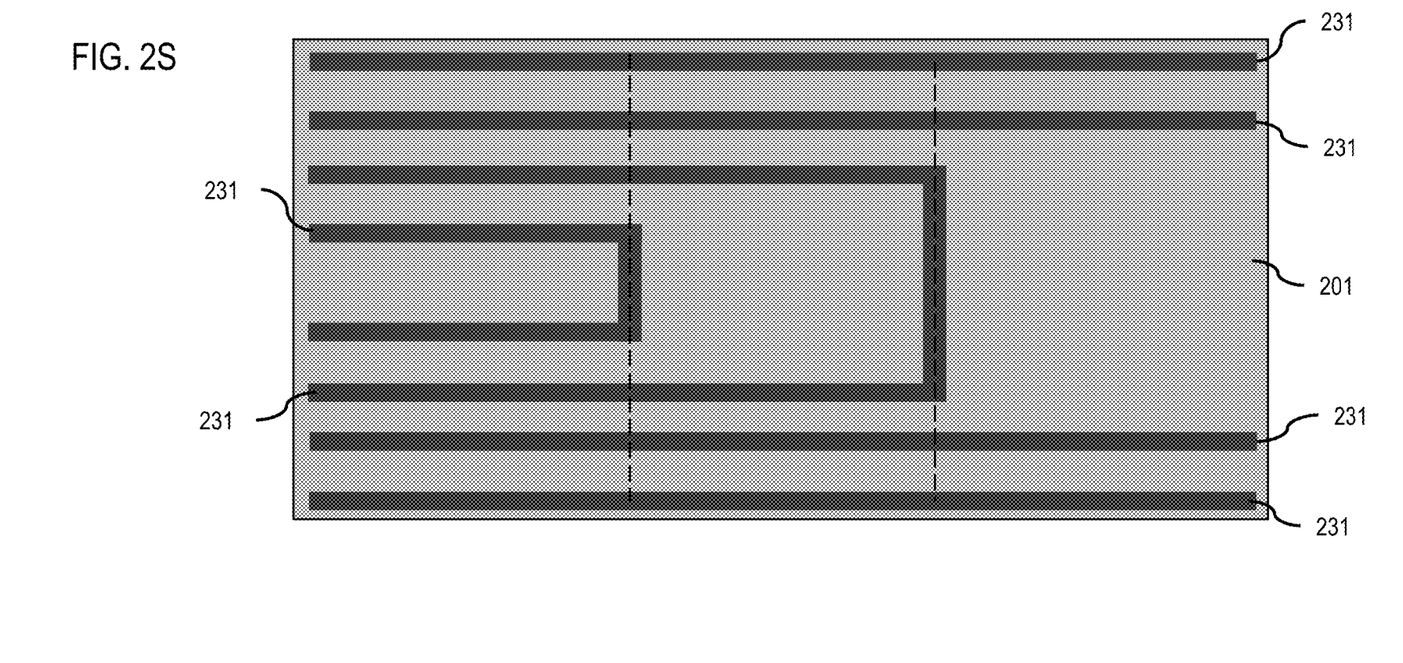

FIG. 2R illustrates a view along x-A and FIG. 2S illustrates a top view, wherein the second mandrels (first spacers 225 as well as the merged spacer 227) have been removed, leaving the second spacers 231 on the upper surface of the Si layer 201.

Figure 2T:
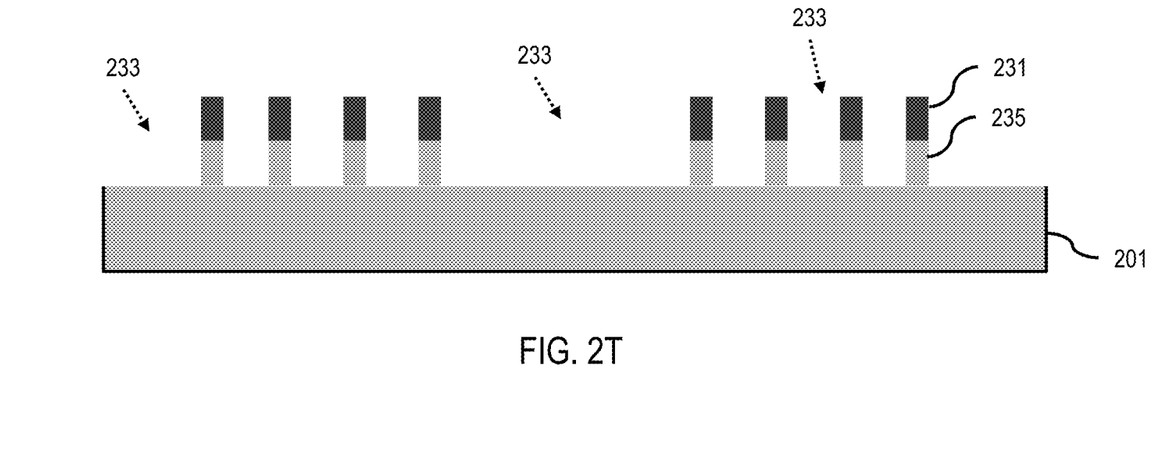
Figure 2U:
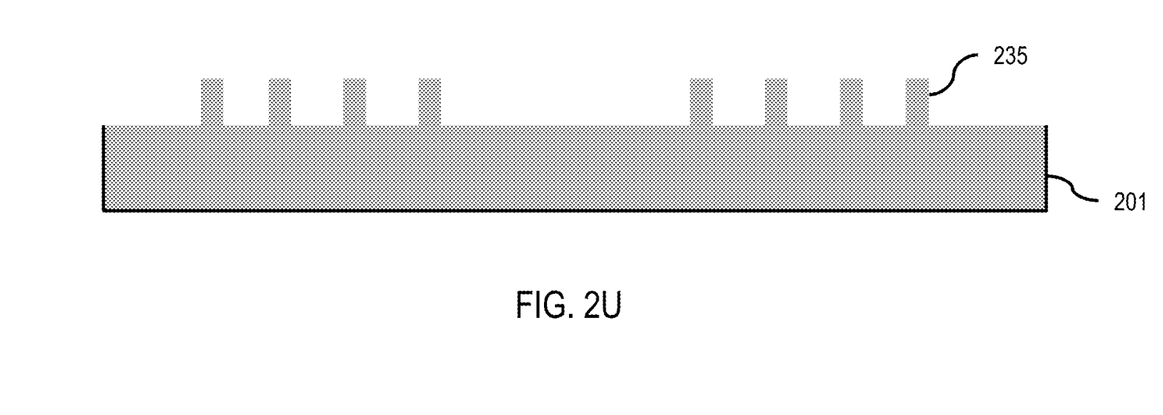

FIG. 2T illustrates a view along x-A, wherein sections 233 of the Si layer 201, exposed through the second spacers 231, are removed (e.g., etched) to form Si fins 235, which are revealed once the second spacers 231 are removed, as illustrated in a view along x-A in FIG. 2U.

Figure 2V:
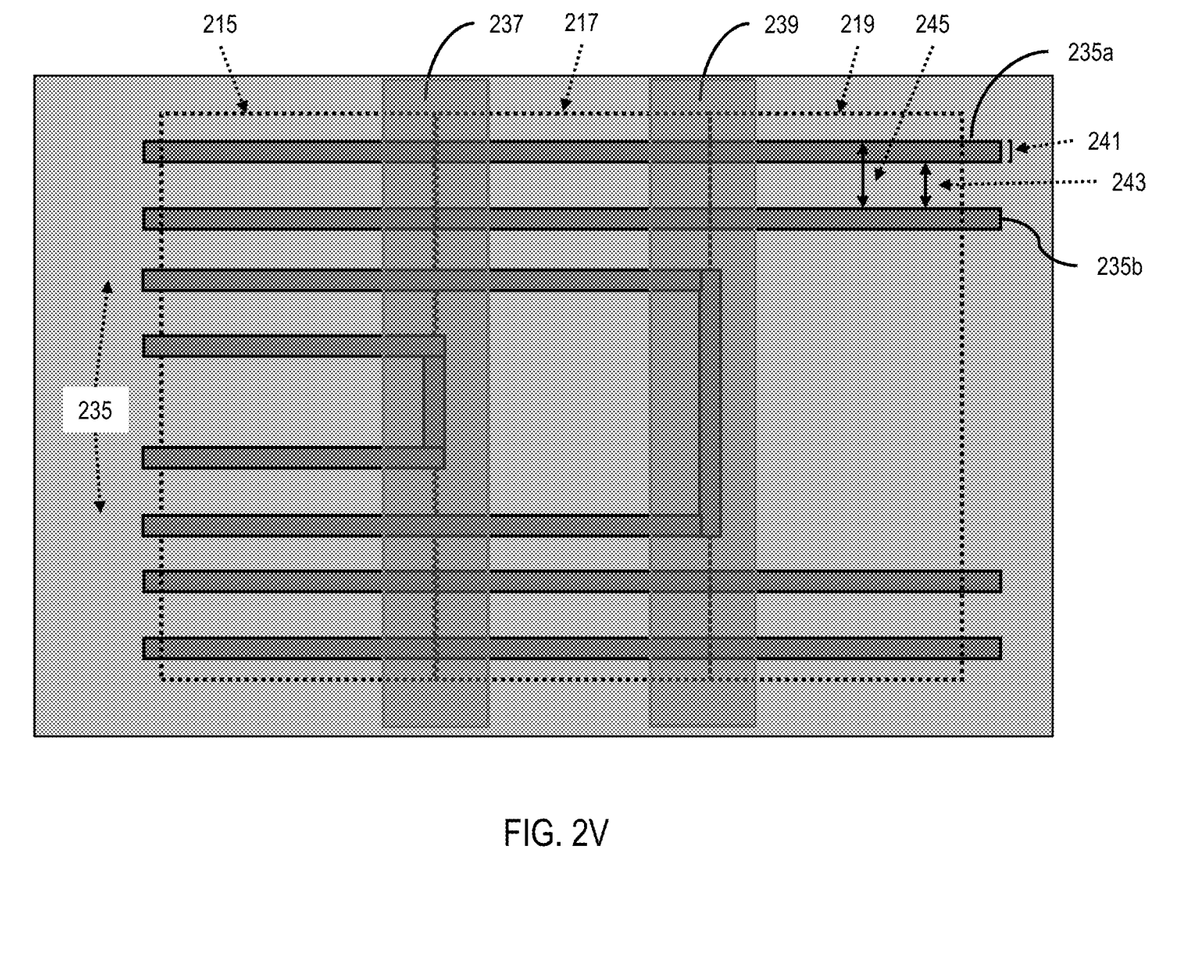

FIG. 2V illustrates a top view, wherein a cut-mask with an opening 237 over a boundary between the first and second cells, 215 and 217, and another opening 239 over a boundary between the second and third cells, 217 and 219, may be utilized to remove segments of the Si fins 235 that are adjacent to and over the boundaries for forming a double diffusion break at each of the boundaries between the adjacent cells 215/217 and 217/219. In one example, a layout of the Si fins 235 includes a fin-width 241 (e.g. fin 235a) at 6 nm, a fin-space 243 between two adjacent fins (e.g. fins 235a and 235b) at 18 nm, and a fin-pitch 245 at 24 nm. In this example layout, the total EPE tolerance would be at 30 nm (+/−15 nm).

Figure 2W:
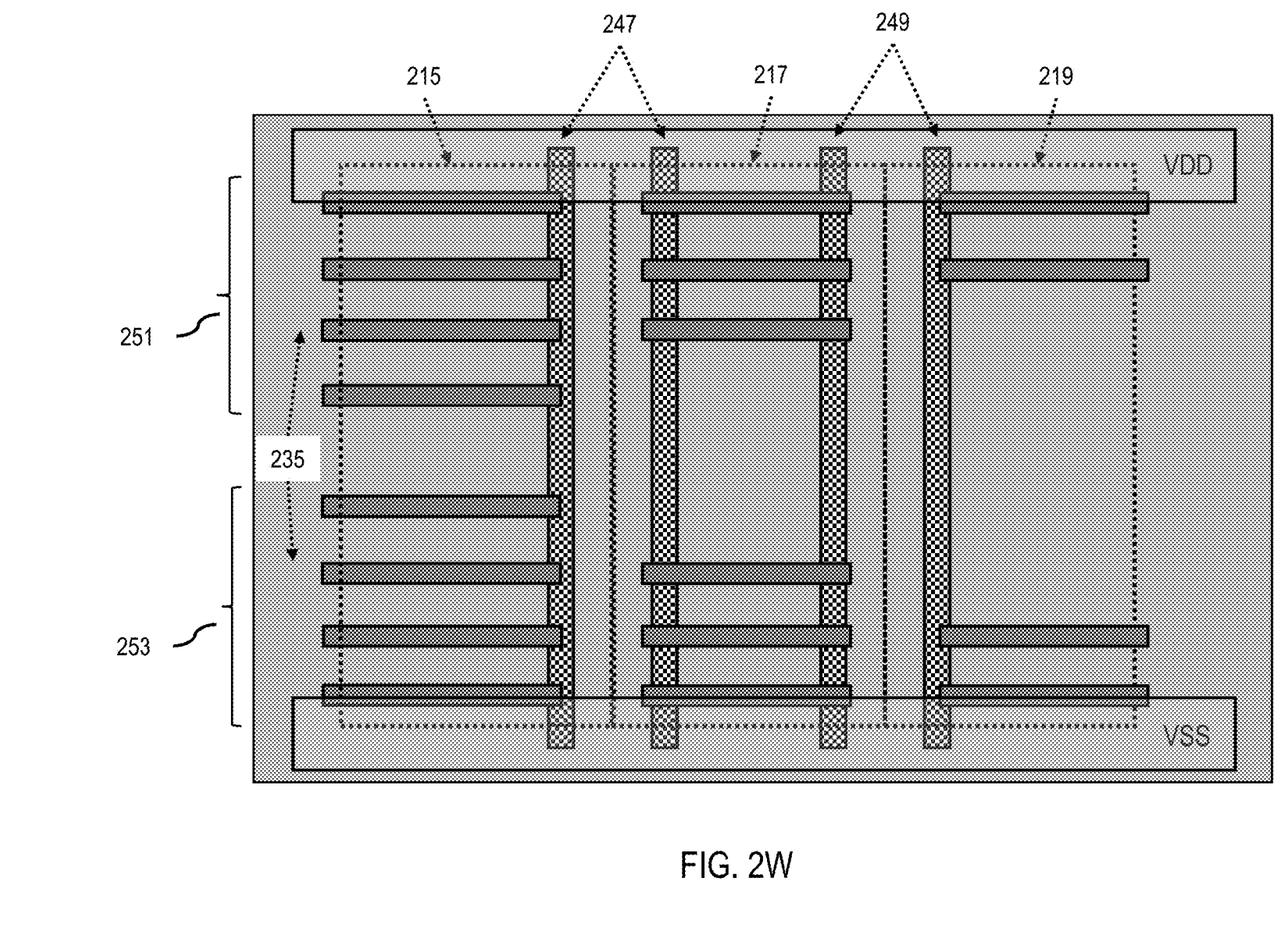

FIG. 2W illustrates a top view of cells 215, 217, and 219 with double diffusion breaks 247 and 249 at the boundaries in between each adjacent pair of cells. Each cell, 215/217/219, includes at least one n-FET 251 and at least one p-FET 253, wherein the first cell 215 includes four active Si fins 235 for each n-FET and p-FET, the second cell 217 includes three active Si fins 235 for each n-FET and p-FET, and the third cell 219 includes two active Si fins 235 for each n-FET and p-FET.

The embodiments of the present disclosure can achieve several technical effects including increasing EPE tolerance for placement of (e.g. horizontal) lithography masks to form or remove spacers utilized in generating fins in a tapered FINFET device without requiring additional masks. Furthermore, the embodiments enjoy utility in various industrial applications as, for example, microprocessors, smart phones, mobile phones, cellular handsets, set-top boxes, DVD recorders and players, automotive navigation, printers and peripherals, networking and telecom equipment, gaming systems, digital cameras, or other devices utilizing logic or high-voltage technology nodes. The present disclosure therefore enjoys industrial applicability in any of various types of highly integrated semiconductor devices, including devices that use SRAM cells (e.g., liquid crystal display (LCD) drivers, digital processors, etc.), particularly for the 7 nm technology node and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
providing first and second mandrels separated from each other across adjacent cells on an upper surface of a silicon (Si) layer;
forming first and second dummy spacers and third and fourth dummy spacers on opposite sides of the first and second mandrels, respectively;
removing, through a block mask, the first and fourth dummy spacers and a portion of the second and third dummy spacers;
forming first spacers on each exposed side of the first and second mandrels and in between the second and third dummy spacers, forming a merged spacer;
removing the mandrels;
removing a section of the merged spacer;
forming second spacers on all exposed sides of the first spacers and the merged spacer;
removing the merged spacer and the first spacers;
removing exposed sections of the Si layer through the second spacers; and
removing the second spacers to reveal Si fins.

2. The method according to claim 1, comprising:
providing the first and second mandrels across first, second, and third consecutive cells; and
utilizing the block mask to block the second and third dummy spacers in the second and third cells.

3. The method according to claim 2, wherein a placement of the block mask has a total edge placement error (EPE) tolerance equal to a sum of a distance between two adjacent Si fins and twice a width of an Si fin.

4. The method according to claim 2, comprising:
removing the section of the merged spacer through a cut-mask with an opening over the merged spacer in the third cell.

5. The method according to claim 2, further comprising:
utilizing a cut-mask with openings over boundaries between the first and second, and the second and third cells; and
removing, through the openings, segments of the Si fins over and adjacent to the boundaries.

6. The method according to claim 2, wherein each cell comprises at least one n-FET and at least one p-FET, the first cell includes four active Si fins for each n-FET and p-FET, the second cell includes three active Si fins for each n-FET and p-FET, and the third cell includes two active Si fins for each n-FET and p-FET.

7. The method according to claim 1, wherein:
the first spacers have a width corresponding to a space between two adjacent Si fins.

8. The method according to claim 1, wherein:
the second spacers have a width corresponding to a Si fin width.

9. The method according to claim 1, wherein:
the mandrels have a pitch corresponding to at least four times a Si fin pitch.

10. A method comprising:
providing first and second mandrels separated from each other across adjacent cells on an upper surface of a silicon (Si) layer;

forming first and second dummy spacers and third and fourth dummy spacers on opposite sides of the first and second mandrels, respectively;

removing, through a block mask, the first and fourth dummy spacers and a portion of the second and third dummy spacers;

forming first spacers on each exposed side of the first and second mandrels and in between the second and third dummy spacers, forming a merged spacer;

removing the first and second mandrels;

removing the first spacers to one side of the merged spacer;

forming second spacers on all exposed sides of the first spacers and the merged spacer;

removing the merged spacer and the first spacers;

removing exposed sections of the Si layer through the second spacers; and removing the second spacers to reveal Si fins.

11. The method according to claim 10, comprising:
providing the first and second mandrels across first, second, and third consecutive cells; and
utilizing the block mask to block the second and third dummy spacers in the second cell only.

12. The method according to claim 11, wherein a placement of the block mask has a total edge placement error (EPE) tolerance equal to a sum of a distance between two adjacent Si fins and twice a width of a Si fin.

13. The method according to claim 11, comprising:
removing the first spacers to one side of the merged spacer through a cut-mask with an opening in the third cell.

14. The method according to claim 11, further comprising:
utilizing a cut-mask with openings over boundaries between the first and second, and the second and third cells; and
removing, through the openings, segments of the Si fins over and adjacent to the boundaries.

15. The method according to claim 14, wherein each cell comprises at least one n-FET and at least one p-FET, the first cell includes four active Si fins for each n-FET and p-FET, the second cell includes three active Si fins for each n-FET and p-FET, and the third cell includes two active Si fins for each n-FET and p-FET.

16. The method according to claim 10, wherein:
the first spacers have a width corresponding to a space between two adjacent Si fins, and the second spacers have a width corresponding to a Si fin width.

17. The method according to claim 10, wherein:
the mandrels have a pitch corresponding to at least four times a Si fin pitch.

18. A method comprising:
providing first and second mandrels, with a pitch corresponding to at least four times a Si fin pitch, separated from each other across first, second, and third consecutive cells on an upper surface of a silicon (Si) layer;

forming first and second dummy spacers and third and fourth dummy spacers on opposite sides of the first and second mandrels, respectively;

removing, through a block mask, the first and fourth dummy spacers and a portion of the second and third dummy spacers in the second and third cells;

forming first spacers, with a width corresponding to a space between two adjacent Si fins, on each exposed side of the first and second mandrels and in between the second and third dummy spacers, forming a merged spacer;

removing the mandrels;

removing a section of the merged spacer through a cut-mask with an opening over the merged spacer in the third cell;

forming second spacers, with a width corresponding to a Si fin width, on all exposed sides of the first spacers and the merged spacer;

removing the merged spacer and the first spacers;

removing exposed sections of the Si layer through the second spacers; and removing the second spacers to reveal Si fins.

19. The method according to claim 18, further comprising:
utilizing a cut-mask with openings over boundaries between the first and second, and the second and third cells; and
removing, through the openings, segments of the Si fins over and adjacent to the boundaries.

20. The method according to claim 18, wherein a placement of the block mask has a total edge placement error (EPE) tolerance equal to a sum of a distance between two adjacent Si fins and twice a width of a Si fin.

* * * * *